United States Patent
Obu et al.

(10) Patent No.: US 9,006,115 B2
(45) Date of Patent: Apr. 14, 2015

(54) SILICON OXIDE FILM FORMING METHOD AND APPARATUS

(71) Applicant: Tokyo Electron Limited, Tokyo (JP)

(72) Inventors: Tomoyuki Obu, Nirasaki (JP); Masaki Kurokawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/930,596

(22) Filed: Jun. 28, 2013

(65) Prior Publication Data
US 2014/0004715 A1    Jan. 2, 2014

(30) Foreign Application Priority Data
Jun. 28, 2012 (JP) ................... 2012-145283

(51) Int. Cl.
| | |
|---|---|
| H01L 21/31 | (2006.01) |
| H01L 21/02 | (2006.01) |
| C23C 16/40 | (2006.01) |
| C23C 16/56 | (2006.01) |
| H01L 21/311 | (2006.01) |

(52) U.S. Cl.
CPC .... *H01L 21/02164* (2013.01); *H01L 21/02211* (2013.01); *H01L 21/02271* (2013.01); *H01L 21/02337* (2013.01); *H01L 21/31111* (2013.01); *C23C 16/401* (2013.01); *C23C 16/56* (2013.01)

(58) Field of Classification Search
None
See application file for complete search history.

(56) References Cited

U.S. PATENT DOCUMENTS

| | | | | |
|---|---|---|---|---|
| 4,239,811 | A | * 12/1980 | Kemlage | 438/787 |
| 2011/0076857 | A1 | * 3/2011 | Akae et al. | 438/769 |

FOREIGN PATENT DOCUMENTS

| | | | |
|---|---|---|---|
| JP | 2001-077105 | A | 3/2001 |
| JP | 2001-085333 | A | 3/2001 |
| JP | 2005-123275 | A | 5/2005 |
| JP | 2008-053412 | A | 3/2008 |

* cited by examiner

*Primary Examiner* — Yasser A Abdelaziez
(74) *Attorney, Agent, or Firm* — Nath, Goldberg & Meyer; Jerald L. Meyer; Tiffany A. Johnson

(57) ABSTRACT

A method of forming a silicone oxide film includes: forming a silicon oxide film on a plurality of target objects by supplying a chlorine-containing silicon source into a reaction chamber accommodating the plurality of target objects; and modifying the silicon oxide film, which is formed by forming the silicon oxide film, by supplying hydrogen and oxygen or hydrogen and nitrous oxide into the reaction chamber and making an interior of the reaction chamber be under a hydrogen-oxygen atmosphere or a hydrogen-nitrous oxide atmosphere.

6 Claims, 6 Drawing Sheets

SILICON OXIDE FILM FORMING METHOD AND APPARATUS

CROSS-REFERENCE TO RELATED APPLICATION

This application claims the benefit of and priority from Japanese Patent Application No. 2012-145283, filed on Jun. 28, 2012, in the Japan Patent Office, the disclosure of which is incorporated herein in its entirety by reference.

TECHNICAL FIELD

The present disclosure relates to a silicon oxide film forming method and a silicon oxide film forming apparatus.

BACKGROUND

A thin film forming process, which forms a thin film such as a silicon oxide film on target objects (e.g., semiconductor wafers), is performed through a Chemical Vapor Deposition (CVD) method in a manufacture process of a semiconductor device. Such thin film forming process may improve the film quality by reducing an impurity concentration in the film during the film formation at a high temperature. For example, a silicon oxide film (i.e., a High Temperature Oxide (HTO) film) may be formed at a high temperature of about 800 degrees C. by the CVD method.

Further, to greatly improve a resistance against a dilute hydrofluoric acid (DHF) in the silicon oxide film formed by the CVD method, the silicone oxide film is doped with impurity, for example, $C_2H_4$, $NH_3$ or the like.

However, doping the silicon oxide film with the impurity such as $C_2H_4$ or NH3 may deteriorate resistances against other chemicals (e.g., $H_3PO_4$) or affect a device performance. Further, there is a demand for improving the etching resistance against $H_3PO_4$ and raising a selectivity ratio against a silicon nitride film.

SUMMARY

Various embodiments of the present disclosure provide a silicon oxide film forming method and a silicon oxide film forming apparatus, which improve an etching resistance but do not degrade a device performance. Further, some embodiments of the present disclosure may improve an etching resistance and may have a high selectivity ratio against a silicon nitride film.

According to a first aspect of the present disclosure, there is provided a method of forming a silicon oxide film including: forming a silicon oxide film on a plurality of target objects by supplying a chlorine-containing silicon source into a reaction chamber accommodating the plurality of target objects; and modifying the silicon oxide film, which is formed by forming the silicon oxide film, by supplying hydrogen and oxygen or hydrogen and nitrous oxide into the reaction chamber and making an interior of the reaction chamber be under a hydrogen-oxygen atmosphere or a hydrogen-nitrous oxide atmosphere.

According to a second aspect of the present disclosure, there is provided a silicone oxide film forming apparatus including: a film forming unit configured to form a silicon oxide film on a plurality of target objects by supplying a chlorine-containing silicon source into a reaction chamber accommodating the plurality of target objects; and a modifying unit configured to modify the silicon oxide film formed by the film forming unit by supplying hydrogen and oxygen or hydrogen and nitrous oxide into the reaction chamber and making an interior of the reaction chamber be under a hydrogen-oxygen atmosphere or a hydrogen-nitrous oxide atmosphere.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Descriptions will be made below as to embodiments of a silicon oxide film method and a silicon oxide film forming apparatus. These embodiments will be described with an example where a vertical batch-type heat treatment apparatus shown in FIG. 1 is used as a silicon oxide film forming apparatus.

Figure 1:
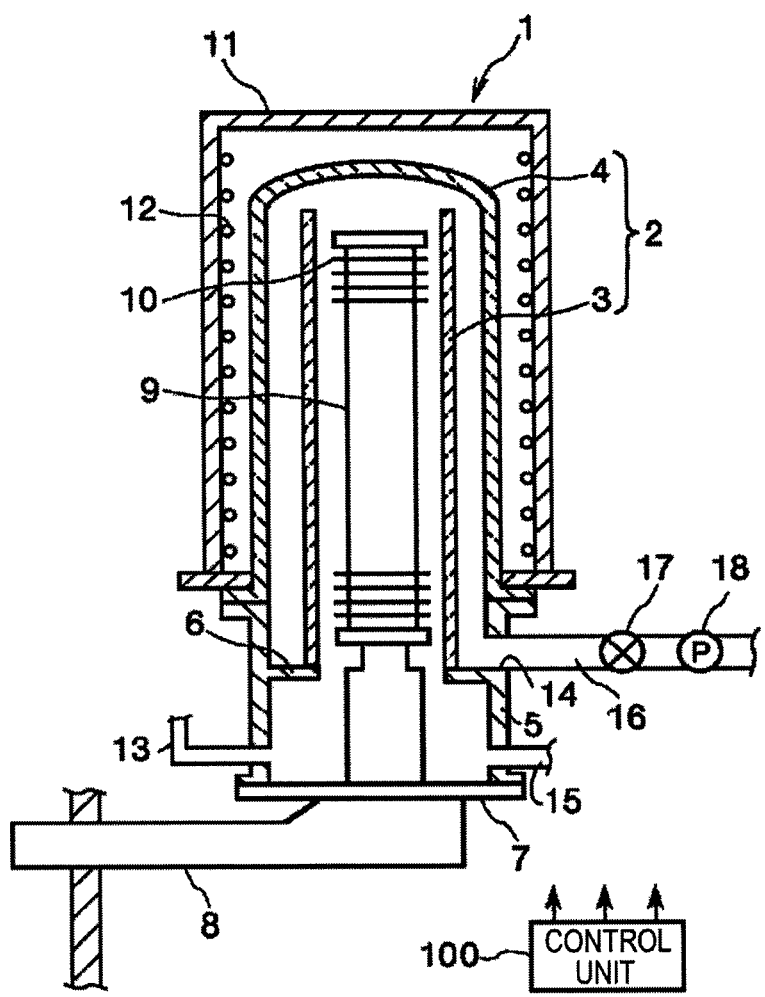
FIG. 1 shows a heat treatment apparatus according to an embodiment of the present disclosure.

As shown in FIG. 1, a heat treatment apparatus 1 includes a cylindrical reaction tube (an example of a reaction chamber) 2, vertically oriented. The reaction tube 2 has a double tube structure, which comprises an inner tube 3 and an outer tube 4 with a ceiling. The outer tube 4 is configured to cover up the inner tube 3 with a uniform spacing inbetween. The inner tube 3 and the outer tube 4 are made of a material having excellent thermal resistance and corrosion resistance, for example, quartz.

A manifold 5, which is formed in a cylindrical shape and is made of stainless steel, is disposed beneath the outer tube 4. The manifold 5 is air-tightly connected to a lower end of the outer tube 4. Further, a support ring 6 supports the inner tube 3. The support ring 6 protrudes from an inner wall of the manifold 5 and is integrally formed together with the manifold 5.

A lid 7 is disposed beneath the manifold 5. The lid 7 is configured to move in a vertical direction by a boat elevator 8. If the lid 7 is elevated by the boat elevator 8, then the lower portion of the manifold 5 (a furnace throat portion) is closed. If the lid 7 is lowered by the boat elevator 8, then the lower portion of the manifold 5 (a furnace throat portion) is opened.

A wafer boat 9, which is made of, for example, quartz, is placed on the lid 7. The wafer boat 9 is configured such that a plurality of target objects (e.g., semiconductor wafers 10) are vertically accommodated at a predetermined spacing.

A thermal insulator 11 is provided around the reaction tube 2 to surround the reaction tube 2. Temperature raising heaters 12, which include, for example, a resistance heating element, are provided on an inner wall surface of the thermal insulator 11. The temperature raising heaters 12 heat the interior of the reaction tube 2 to a predetermined temperature, thereby heating semiconductor wafers 10 to a predetermined temperature.

A plurality of processing gas introduction pipes 13 are inserted through (connected to) a side wall of the manifold 5. Only one of the processing gas introduction pipes is shown in FIG. 1. The processing gas introduction pipes 13 are disposed to face to the interior of the inner tube 3. For example, as shown in FIG. 1, the processing gas introduction pipes 13 are inserted through the side wall of the manifold 5 that is below the support ring 6 (below the inner tube 3).

A processing gas supply source (not shown) is connected to the processing gas introduction pipes 13 via a mass flow controller (not shown). Thus, a desired amount of processing gas is supplied from the processing gas supply source into the reaction tube 2 through the processing gas introduction pipes 13. For example, the processing gas supplied from the processing gas introduction pipes 13 may include a film forming gas for forming a silicon oxide film and a modifying gas for modifying the film quality of the formed silicon oxide film. The film forming gas includes an oxidizing agent and a silicon source containing chlorine (Cl). The chlorine (Cl) containing silicon source may include tetrachlorosilane, trichlorosilane, dichlorosilane (DCS), monochlorosilane, hexachlorodisilane (HCD) or the like. The oxidizing agent may include nitrous oxide ($N_2O$), nitrogen monoxide (NO), nitrogen dioxide ($NO_2$), ozone ($O_3$) or the like. The modifying gas may include gas ($H_2+O_2$) consisting of oxygen ($O_2$) and hydrogen ($H_2$) or gas ($H_2+N_2O$) consisting of hydrogen ($H_2$) and nitrous oxide ($N_2O$).

An exhaust port 14 for evacuating the gas in the reaction tube 2 is provided in the side wall of the manifold 5. The exhaust port 14 is positioned above the support ring 6 and connected to a space defined between the inner tube 3 and the outer tube 4 in the reaction tube 2. An exhaust gas, which is produced from the inner tube 3, passes through the space between the inner tube 3 and the outer tube 4 and is evacuated through the exhaust port 14.

A purge gas supply pipe 15 is inserted through the side wall of the manifold 5 below the exhaust port 14. A purge gas supply source (not shown) is connected to the purge gas supply pipe 15. A desired amount of purge gas (e.g., nitrogen gas) is supplied from the purge gas supply source into the reaction tube 2 through the purge gas supply pipe 15.

An exhaust pipe 16 is air-tightly connected to the exhaust port 14. The exhaust pipe 16 is equipped with a valve 17 and a vacuum pump 18 from the upstream side of the exhaust pipe 16. The valve 17 adjusts an opening of the exhaust pipe 16 controlling a pressure in the reaction tube 2 to a predetermined pressure. The vacuum pump 18 evacuates the gas in the reaction tube 2 through the exhaust pipe 16 and adjusts the pressure in the reaction tube 2.

Further, the exhaust pipe 16 is equipped with a trap (not shown), a scrubber (not shown), etc. The exhaust pipe 16 is configured to detoxify the exhaust gas evacuated from the reaction tube 2 and then to evacuate the exhaust gas out of the heat treatment apparatus 1.

Figure 2:
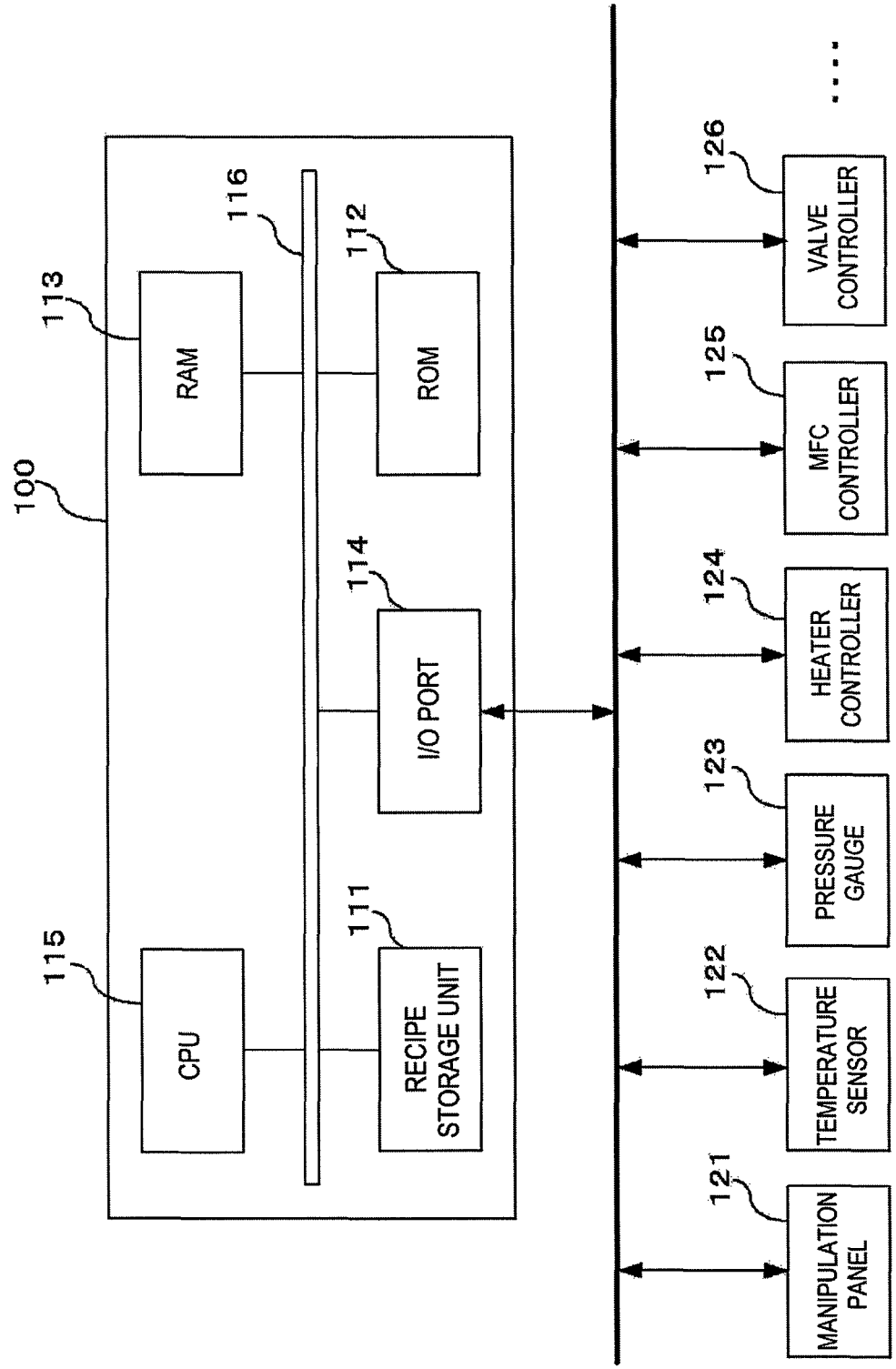
FIG. 2 shows a configuration of a control unit shown in FIG. 1.

Further, the heat treatment apparatus 1 includes a control unit 100 for controlling each component of the heat treatment apparatus. FIG. 2 shows a configuration of the control unit 100. As shown in FIG. 2, a manipulation panel 121, a temperature sensor (temperature sensor group) 122, a pressure gauge (pressure gauge group) 123, a heater controller 124, a MFC controller 125, and a valve controller 126 are connected to the control unit 100.

The manipulation panel 121 has a display screen and manipulation buttons. The manipulation panel 121 transmits operator's manipulation instructions to the control unit 100. Further, the manipulation panel 121 displays various information from the control unit 100 on the display screen.

The temperature sensor (temperature sensor group) 122 measures the temperature in each component such as the reaction tube 2, the processing gas introduction pipes 13, or the exhaust pipe 16. The temperature sensor (temperature sensor group) 122 informs the control unit 100 of such measured values.

The pressure gauge (pressure gauge group) 123 measures the pressure in each component such as the reaction tube 2, the processing gas introduction pipes 13, or the exhaust pipe 16. The pressure gauge (pressure gauge group) 123 informs the control unit 100 of such measured values.

The heater controller 124 controls each of the temperature raising heaters 12. The heater controller 124 electrifies and heats the temperature raising heaters 12 in response to the instructions from the control unit 100. Further, the heater controller 124 measures the electric power consumption of the respective temperature raising heaters 12 and informs the control unit 100 of such measured values.

The MFC controller 125 controls the mass flow controllers (MFC) (not shown) provided in the processing gas introduction pipes 13 and the purge gas supply pipe 15. The MFC controller 125 sets the flow rates of the gases, which flow through the processing gas introduction pipes 13 and the purge gas supply pipe 15, to the flow rates instructed by the control unit 100. Further, the MFC controller 125 measures the flow rates of the gases flowing and informs the control unit 100 of such measured values.

The valve controller 126 controls the opening degree of the valve disposed in each pipe to the values instructed by the control unit 100.

The control unit 100 includes a recipe storage unit 111, a read only memory (ROM) 112, a random access memory (RAM) 113, an input/output (I/O) port 114, a central processing unit (CPU) 115 and a bus 116 interconnecting those components.

A setup recipe and a plurality of process recipes are stored in the recipe storage unit 111. When the heat treatment apparatus 1 is manufactured, only the setup recipe is stored in the recipe storage unit 111. The setup recipe is executed when creating a thermal model suitable for each heat treatment apparatus. The process recipe is prepared for every heat treatment (process) which the user really performs. For example, the process recipe prescribes the temperature change in each component, the pressure change in the reaction tube 2, the timing of beginning and stopping the supply of the processing gas, the supply amount of the processing gas, etc. from the time of loading the semiconductor wafers 10 into the reaction tube 2 until the time of unloading the processed semiconductor wafers 10.

The ROM 112 includes an electrically erasable programmable read only memory (EEPROM), a flash memory, a hard disc or the like. The ROM 112 is a recording medium which stores an operating program of the CPU 115. The RAM 113 functions as a work area of the CPU 115.

The I/O port 114 is connected to the manipulation panel 121, the temperature sensor (temperature sensor group) 122, the pressure gauge (pressure gauge group) 123, the heater controller 124, the MFC controller 125 and the valve controller 126. The I/O port 114 controls the input and output of data or signals.

The CPU 115 constitutes the center of the control unit 100. The CPU 115 executes the operating program stored in the ROM 112 and controls the operation of the heat treatment apparatus 1 along the recipe (the process recipe) stored in the recipe storage unit 111 in accordance with the instructions from the manipulation panel 121. That is, the CPU 115 allows the temperature sensor (temperature sensor group) 122, the pressure gauge (pressure gauge group) 123 and the MFC controller 125 to measure the temperature, the pressure and the flow rate in each component such as the reaction tube 2, the processing gas introduction pipes 13 and the exhaust pipe 16. Based on those measured data, the CPU 115 outputs control signals to the heater controller 124, the MFC controller 125 and the valve controller 126 and controls the aforementioned components such that they comply with the process recipe.

The bus 116 transmits information from one component to another component.

Next, descriptions will be made as to a silicon oxide film forming method, which uses the heat treatment apparatus 1 having the above-described configuration. In the following description, the control unit 100 (the CPU 115) controls the operation of each component constituting the heat treatment apparatus 1. Further, the temperature, the pressure, the gas flow rate, etc. in the reaction tube 2 in each process are set to the conditions complying with the recipe, for example, shown in FIG. 3, by controlling the heater controller 124 (the temperature raising heaters 12), the MFC controller 125, the valve controller 126, etc. through the control unit 100 (the CPU 115), as described above.

Figure 3:
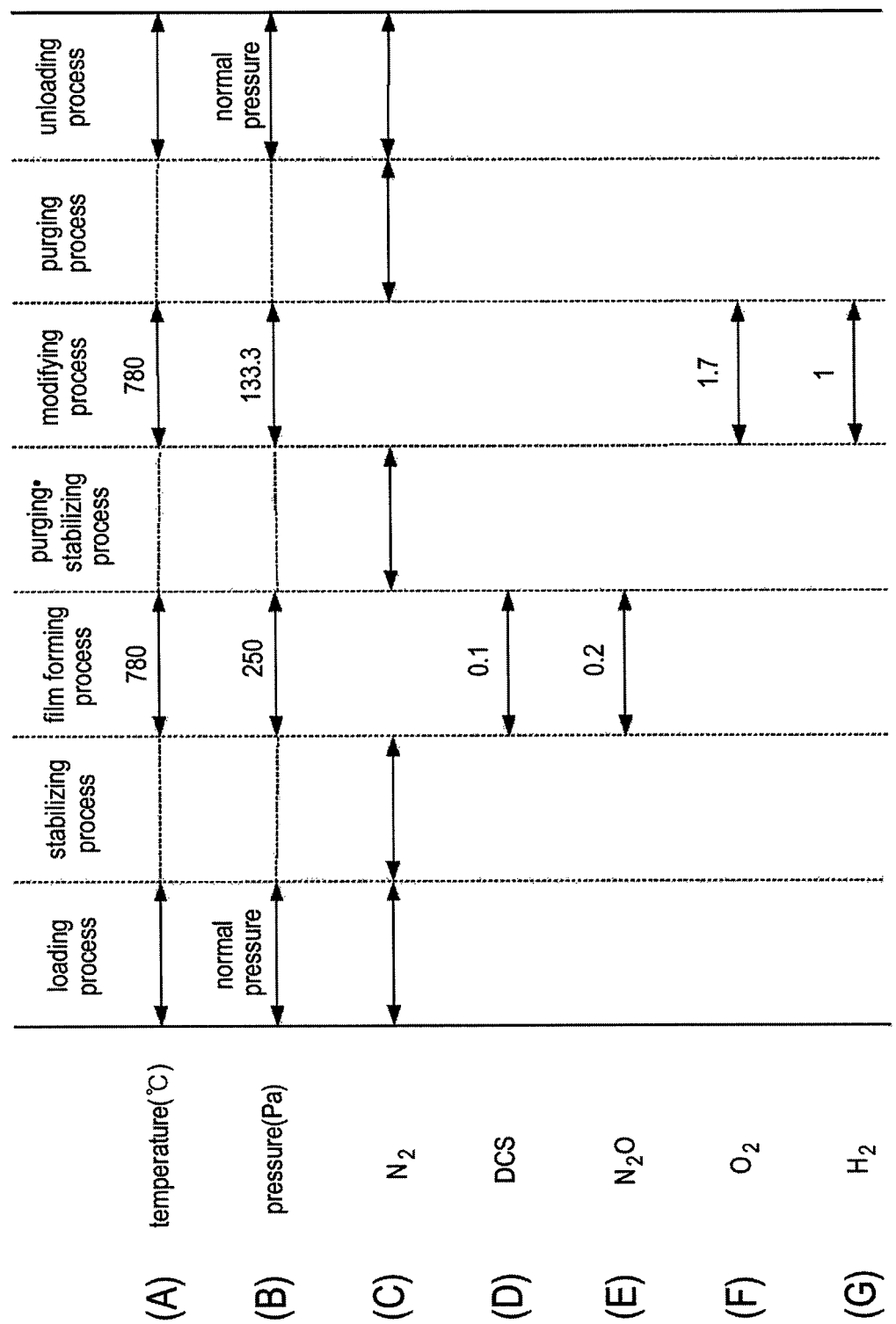
FIG. 3 is a diagram illustrating a recipe relating to a silicon oxide film forming method according to an embodiment of the present disclosure.

First, as shown by (A) of FIG. 3, the interior of the reaction tube 2 (the inner tube 3) is set to a predetermined temperature. Further, as shown by (C) of FIG. 3, a predetermined amount of nitrogen is supplied from the purge gas supply pipe 15 into the inner tube 3 (the reaction tube 2). Next, the wafer boat 9 which accommodates the semiconductor wafers 10 is placed on the lid 7. Then, the lid 7 is elevated by the boat elevator 8, thereby loading the semiconductor wafers 10 (the wafer boat 9) into the reaction tube 2 (loading process).

Subsequently, as shown by (C) of FIG. 3, a predetermined amount of nitrogen is supplied from the purge gas supply pipe 15 into the inner tube 3. Also, the interior of the reaction tube 2 is set to a predetermined temperature, for example, 780 degrees C., as shown by (A) of FIG. 3. Further, the gas in the reaction tube 2 is discharged and the reaction tube 2 is depressurized to a predetermined pressure, for example, 250 Pa (1.88 Torr) as shown by (B) of FIG. 3. Then, the interior of the reaction tube 2 is stabilized at the predetermined temperature and pressure (stabilizing process).

In a film forming process, the temperature in the reaction tube 2 may be preferably 600 to 1000 degrees C., more preferably 700 to 900 degrees C. Further, in the film forming process, the pressure in the reaction tube 2 may be preferably 1.33 to 1330 Pa (0.01 to 10 Torr), more preferably 13.3 to 665 Pa (0.1 to 5 Torr). When the temperature and pressure in the reaction tube 2 are set to the aforementioned ranges, the silicon oxide film can be more uniformly formed.

If the interior of the reaction tube 2 is stabilized at the predetermined temperature and pressure, the supply of nitrogen from the purge gas supply pipe 15 is stopped. Then, as shown by (D) of FIG. 3, a predetermined amount of the film forming gas, for example, the DCS gas (the silicon source) is supplied from the processing gas introduction pipes 13 into the reaction tube 2 at a flow rate of 0.1 slm, and $N_2O$ (the oxidizing agent) is supplied at a flow rate of 0.2 slm (film forming process) as shown by (E) of FIG. 3. By doing so, the silicon oxide film (HTO film) is formed on the surface of the semiconductor wafers 10.

If a predetermined amount of the silicon oxide film is formed on the semiconductor wafers 10, the supply of the film forming gas from the processing gas introduction pipes 13 is stopped. Next, as shown by (A) of FIG. 3, the temperature in the reaction tube 2 is maintained at 780 degrees C. Further, the gas in the reaction tube 2 is discharged and the reaction tube 2 is depressurized to a predetermined pressure, for example, 133.3 Pa (1 Torr) as shown by (B) of FIG. 3. Then, the interior of the reaction tube 2 is stabilized at those temperature and pressure (purging and stabilizing process). To completely discharge the gas in the reaction tube 2, it is preferred that the discharge of the gas in the reaction tube 2 and the supply of the nitrogen gas are repeated several times.

In a modifying process, the temperature in the reaction tube 2 may be preferably 600 to 1000 degrees C., more preferably 700 to 900 degrees C. Further, in the modifying process, the pressure in the reaction tube 2 may be preferably 1.33 to 1330 Pa (0.01 to 10 Torr), more preferably 13.3 to 665 Pa (0.1 to 5 Torr). This is because hydrogen or chlorine contained in the silicon oxide film can be easily removed and the silicon oxide film can be easily modified when the temperature and pressure in the reaction tube 2 are set to the aforementioned ranges. Further, the temperature in the reaction tube 2 in the modifying process may be preferably the temperature in the reaction tube 2 in the film forming process ±100 degrees C. and more preferably ±50 degrees C. Most preferably, the temperature in the reaction tube 2 in the modifying process may be approximately equal to the temperature in the reaction tube 2 in the film forming process. This is because it is easy to control the temperature in the reaction tube 2.

If the interior of the reaction tube 2 is stabilized at the predetermined temperature and pressure, a predetermined amount of nitrogen is supplied from the purge gas supply pipe 15 into the inner tube 3 as shown by (C) of FIG. 3, and the modifying gas ($H_2+O_2$) including oxygen ($O_2$) and the hydrogen ($H_2$) is supplied from the processing gas introduction pipes 13 into the reaction tube 2 as shown by (F) and (G) of FIG. 3. For example, as shown by (F) of FIG. 3, oxygen ($O_2$) is supplied at a flow rate of 1.7 slm from the processing gas introduction pipes 13 into the reaction tube 2, and hydrogen ($H_2$) is supplied at a flow rate of 1 slm as shown by (G) of FIG. 3 (modifying process). As such, through the modifying process under a hydrogen-oxygen atmosphere (i.e., $H_2+O_2$ atmosphere), hydrogen or chlorine, which is contained in the silicon oxide film formed on the surface of the semiconductor wafers 10, is removed, thereby not only improving the etching resistance of the silicon oxide film but also preventing degradation of a device performance. Further, it is possible to raise a selectivity ratio against a silicon nitride film.

In this regard, a ratio of the supply amount of oxygen ($O_2$) to the supply amount of hydrogen ($H_2$) may be preferably 1.2:1 to 3:1, more preferably 1.5:1 to 2:1. This is because the etching resistance of the silicon oxide film is further improved and the device performance is not affected when the mix ratio of oxygen to hydrogen is set to the aforementioned ranges. Further, this is because the etching resistance of silicon oxide film can be improved and the selectivity ratio against the silicon nitride film can be raised.

If the modifying process on the silicon oxide film is finished, then the supply of the modifying gas from the processing gas introduction pipes 13 is stopped. Next, as shown by (C) of FIG. 3, a predetermined amount of nitrogen is supplied from the purge gas supply pipe 15 into the inner tube 3, and the temperature in the reaction tube 2 is set to a predetermined temperature as shown by (A) of FIG. 3. Further, the gas in the reaction tube 2 is discharged and the pressure in the reaction tube 2 is restored to a normal pressure (purging process). Further, to completely discharge the gas in the reaction tube 2, it is preferred that the discharge of the gas in the reaction tube 2 and the supply of the nitrogen gas are repeated several times. Then, the boat elevator 8 lowers the lid 7 unloading the semiconductor wafers 10 (the wafer boat 9) out of the interior of the reaction tube 2 (unloading process). At such point, the formation of the silicon oxide film is finished.

Figure 4:
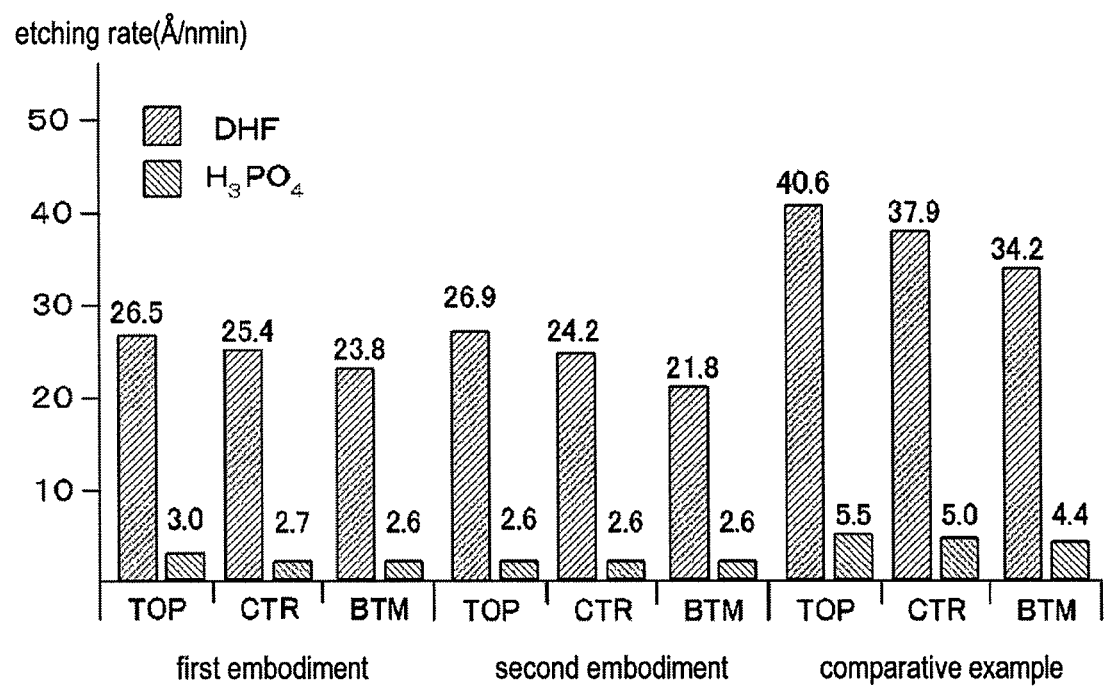
FIG. 4 is a graph showing a wet etching rate in DHF and $H_3PO_4$.

To confirm the effects of the silicon oxide film forming method according to the present disclosure, the silicon oxide film (HTO film) was formed on the semiconductor wafers 10 along the recipe shown in FIG. 3 and thereafter a wet etching rate of the HTO film was measured in DHF wherein DHF and deionized water (DIW) are mixed at a ratio of 50% DHF: DIW=1:200. Further, the HTO film was formed on the semiconductor wafers 10 along the recipe shown in FIG. 3 and thereafter a wet etching rate of the HTO film was measured in $H_3PO_4$ at 160 degrees C. (first embodiment). When hydrogen is supplied at a flow rate of 0.35 slm together with the film forming gas in the film forming process, wet etching rates of the HTO film in DHF and $H_3PO_4$ were measured (second embodiment). FIG. 4 shows the wet etching rates of the HTO film in DHF and $H_3PO_4$ in the first and second embodiments as well as the wet etching rates in a comparative example where the modifying process is not performed.

As shown in FIG. 4, the modifying process reduces the wet etching rates of the HTO film in DHF and $H_3PO_4$ and improves the resistance against DHF and $H_3PO_4$.

Figure 5:
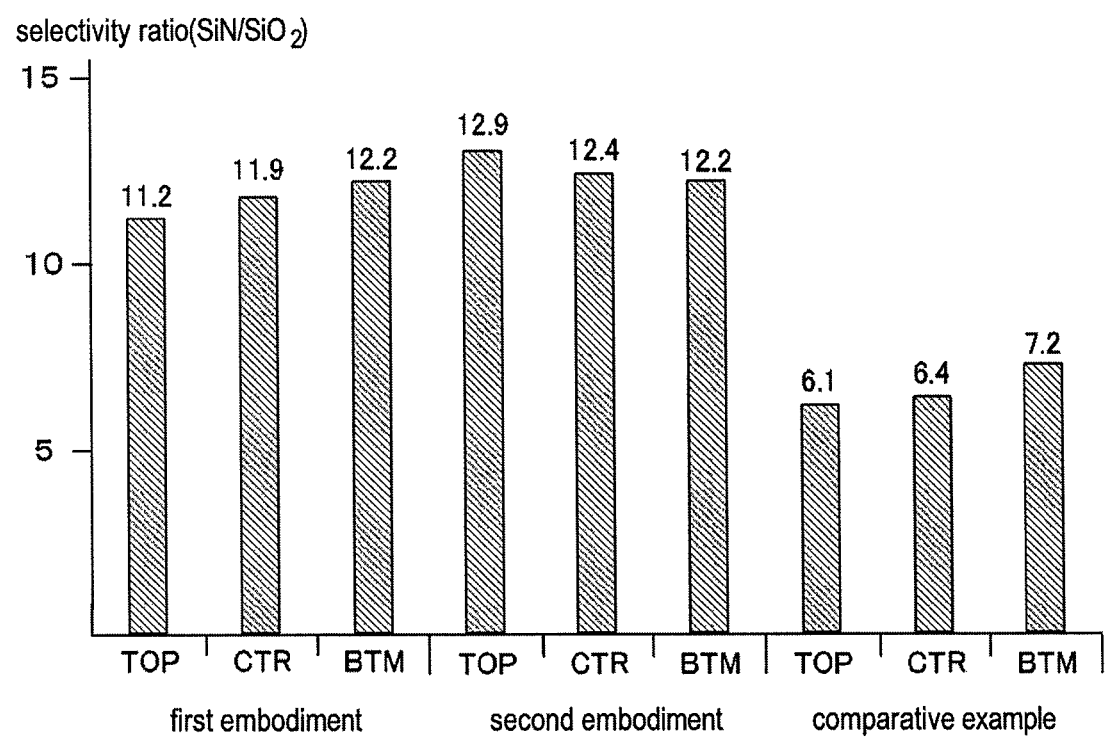
FIG. 5 is a graph showing a selectivity ratio against a silicon nitride film in $H_3PO_4$.

Further, the selectivity ratio against the silicon nitride film was calculated in $H_3PO_4$ with respect to the first embodiment, the second embodiment and the comparative example. FIG. 5 shows the calculated results. It is confirmed that, by performing the modifying process, the selectivity ratio against the silicon nitride film is raised.

Figure 6:
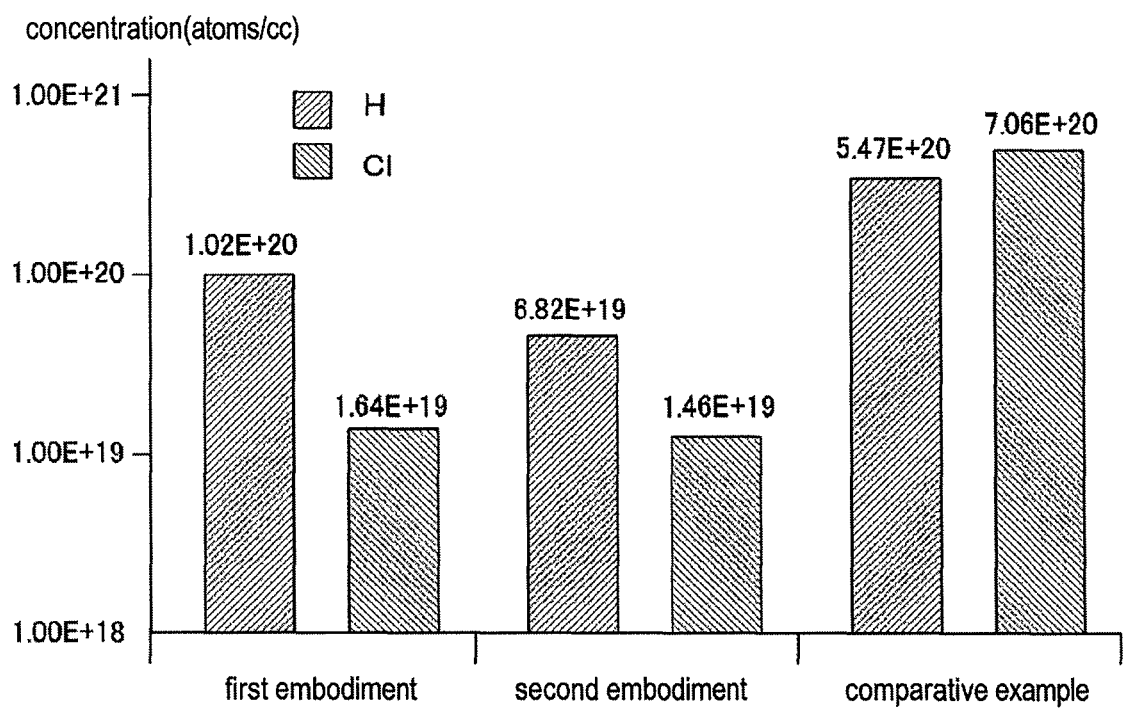
FIG. 6 is a graph showing the concentrations of hydrogen and chlorine contained in a silicon oxide film.

Further, FIG. 6 shows the concentrations of hydrogen (H) and chorine (Cl), contained in the silicon oxide film, were measured with respect to the first embodiment, the second embodiment and the comparative example. As shown in FIG. 6, both the concentration of hydrogen (H) and the concentration of chlorine (Cl) decrease in the first and second embodiments when compared with the comparative example. Thus, it is confirmed that the modifying process decreases the concentration of hydrogen and the concentration of chlorine.

Accordingly, the modifying process improves the etching resistance but prevents the degradation of the device performance. Further, the modifying process improves the etching resistance of the silicon oxide film and raises the selectivity ratio against the silicon nitride film.

As described herein before, according to the embodiments of the present disclosure, the modifying process is performed after the film forming process forming the silicon oxide film, thus improving the etching resistance and not affecting a device performance. Further, the etching resistance of a silicon oxide film can be improved and the selectivity ratio against the silicon nitride film can be raised.

Various other changes and application may be made from the hereinbefore-described embodiments. Other embodiments which may fall within the present disclosure will be described below.

The foregoing embodiments are described with an example where DCS is used as the film forming gas. However, the film forming gas may include a chlorine-containing silicon source such as tetrachlorosilane, trichlorosilane or hexachlorodisilane (HCD). Further, the oxidizing agent may include nitrogen monoxide (NO), nitrogen dioxide ($NO_2$) or ozone ($O_3$).

The foregoing embodiments are described with an example where the gas ($H_2+O_2$) consisting of oxygen ($O_2$) and hydrogen ($H_2$) is used as the modifying gas. However, the modifying gas may include gas ($H_2+N_2O$) consisting of hydrogen ($H_2$) and nitrous oxide ($N_2O$). In this case, similar to the foregoing embodiments, the etching resistance is improved and the device performance is not affected. Further, the etching resistance of the silicon oxide film can be improved and the selectivity ratio against the silicon nitride film can be raised.

Further, hydrogen may be supplied together with the film forming gas in the film forming process. In this case, similar to the foregoing embodiments, the etching resistance is improved and the device performance is not affected. Further, the etching resistance of the silicon oxide film can be improved and the selectivity ratio against the silicon nitride film can be raised.

The foregoing embodiments are described with an example where the vertical batch-type heat treatment apparatus having a double tube structure is used as the heat treatment apparatus. However, a batch-type heat treatment apparatus having a single-tube structure may be used as the heat treatment apparatus.

The control unit 100 according to the embodiments may be realized using a normal computer system, regardless of a dedicated system. For example, the control unit 100, which executes the above-described processes, may be constructed by, for example, installing a program for executing the above-described processes in a general-purpose computer from a recording medium (a flexible disc, a CD-ROM, etc.) which stores said program.

Means for supplying such programs is arbitrary. The programs may be supplied through the aforementioned predetermined recording medium. Further, the programs may be supplied through, for example, a communication line, a communication network, a communication system or the like. In such a case, the programs may be posted on, for example, a bulletin board system (BBS) of a communication network and may be supplied through a network as superimposed on a carrier wave. The above-described processes may be performed by activating the program supplied in the aforementioned manner and executing it under the control of an operating system (OS) in the same manner as other application programs.

The present disclosure provides the embodiments of the silicon oxide film forming method and apparatus, which improve the etching resistance and do not affect a device performance. Further, the present disclosure provides the embodiments of the silicon oxide film forming method and apparatus, which improve the etching resistance and have the high selectivity ratio against the silicon nitride film.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon oxide film, comprising:

forming a silicon oxide film on a plurality of target objects by supplying a film forming gas including a chlorine-containing silicon source and an oxidizing agent into a reaction chamber accommodating the plurality of target objects throughout a period of time for forming the silicon oxide film in a first step; and after forming the silicon oxide film, modifying the silicon oxide film by supplying hydrogen and oxygen or hydrogen and nitrous oxide into the reaction chamber and making an interior of the reaction chamber be under a hydrogen-oxygen atmosphere or a hydrogen-nitrous oxide atmosphere to increase an etching selectivity ratio of the silicon oxide film against a silicon nitride film, wherein a temperature in the reaction chamber while forming the silicon oxide film is approximately equal to a temperature in the reaction chamber while modifying the silicon oxide film.

2. The method of claim 1, wherein the chlorine-containing silicon source includes one of tetrachlorosilane, trichlorosilane, dichlorosilane, monochlorosilane and hexachlorodisilane.

3. The method of claim 1, wherein a temperature in the reaction chamber is maintained at 600 to 1000 degrees C. at forming the silicon oxide film and modifying the silicon oxide film.

4. The method of claim 1, wherein modifying the silicon oxide film includes supplying the hydrogen and the oxygen into the reaction chamber at a ratio of a supply amount of the oxygen to a supply amount of the hydrogen ranging from 1.2:1 to 3:1.

5. A silicon oxide film forming apparatus, comprising:

a film forming unit configured to form a silicon oxide film on a plurality of target objects by supplying a film forming gas including a chlorine-containing silicon source and an oxidizing agent into a reaction chamber accommodating the plurality of target objects throughout a period of time for forming the silicon oxide film; and a modifying unit configured to modify the silicon oxide film formed by the film forming unit by supplying hydrogen and oxygen or hydrogen and nitrous oxide into the reaction chamber and making an interior of the reaction chamber be under a hydrogen oxygen atmosphere or a hydrogen-nitrous oxide atmosphere to increase an etching selectivity ratio of the silicon oxide film against a silicon nitride film, wherein a temperature in the reaction chamber while forming the silicon oxide film is approximately equal to a temperature in the reaction chamber while modifying the silicon oxide film.

6. The apparatus of claim 4, wherein the chlorine-containing silicon source includes one of tetrachlorosilane, trichlorosilane, dichlorosilane, monochlorosilane and hexachlorodisilane.

* * * * *

UNITED STATES PATENT AND TRADEMARK OFFICE
CERTIFICATE OF CORRECTION

PATENT NO.      : 9,006,115 B2
APPLICATION NO. : 13/930596
DATED           : April 14, 2015
INVENTOR(S)     : Tomoyuki Obu et al.

It is certified that error appears in the above-identified patent and that said Letters Patent is hereby corrected as shown below:

In the Claims

Claim 6, Column 10, Line 24: Please delete "claim 4" and replace with --claim 5--.

Signed and Sealed this
Eighteenth Day of August, 2015

Michelle K. Lee
*Director of the United States Patent and Trademark Office*